(12) United States Patent  (10) Patent No.: US 8,319,351 B2
Lee  (45) Date of Patent: Nov. 27, 2012

(54) PLANAR MULTI SEMICONDUCTOR CHIP PACKAGE

(75) Inventor: Jong-Joo Lee, Gyeonggi-do (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 93 days.

(21) Appl. No.: 12/689,717

(22) Filed: Jan. 19, 2010

(65) Prior Publication Data

US 2010/0117215 A1     May 13, 2010

Related U.S. Application Data

(63) Continuation of application No. 11/951,024, filed on Dec. 5, 2007, now Pat. No. 7,675,181.

(30) Foreign Application Priority Data

Dec. 5, 2006 (KR) .............................. 2006-0122589

(51) Int. Cl.
*H01L 23/48* (2006.01)
*H01L 23/52* (2006.01)
*H01L 29/40* (2006.01)

(52) U.S. Cl. ........ 257/777; 257/690; 257/723; 257/778; 438/107

(58) Field of Classification Search .................. None
See application file for complete search history.

(56) References Cited

U.S. PATENT DOCUMENTS

| | | | |
|---|---|---|---|
| 5,760,478 A | 6/1998 | Bozso et al. | |
| 6,291,844 B1 * | 9/2001 | Aoki | 257/209 |
| 6,392,304 B1 | 5/2002 | Butler | |
| 6,566,232 B1 * | 5/2003 | Hara et al. | 438/455 |
| 7,294,936 B2 | 11/2007 | Kondo | |
| 2002/0074668 A1 * | 6/2002 | Hofstee et al. | 257/777 |
| 2006/0038272 A1 * | 2/2006 | Edwards | 257/686 |
| 2006/0118972 A1 * | 6/2006 | Baek et al. | 257/786 |
| 2007/0023887 A1 | 2/2007 | Matsui | |

FOREIGN PATENT DOCUMENTS

JP     11-330257     11/1999

* cited by examiner

*Primary Examiner* — Evan Pert
*Assistant Examiner* — Andres Munoz
(74) *Attorney, Agent, or Firm* — Muir Patent Consulting, PLLC (57) ABSTRACT

Provided are a planar multi semiconductor chip package in which a processor and a memory device are connected to each other via a through electrode and a method of manufacturing the planar multi semiconductor chip package. The planar multi semiconductor chip package includes: a substrate comprising a plurality of first circuit patterns on a first surface and a plurality of second circuit patterns on a second surface; a first semiconductor chip comprising a plurality of memory devices arranged on the substrate, wherein first memory devices surround at least a portion of second memory devices; a second semiconductor chip stacked on the first semiconductor chip and corresponding to the second memory devices; and a plurality of through electrodes arranged on the second memory devices and connecting the first and second semiconductor chips to the second circuit pattern of the substrate.

26 Claims, 12 Drawing Sheets

PLANAR MULTI SEMICONDUCTOR CHIP PACKAGE

CROSS-REFERENCE TO RELATED PATENT APPLICATION

This application claims priority under 35 U.S.C. §120 and is a continuation of U.S. patent application Ser. No. 11/951,024, filed on Dec. 5, 2007, now U.S. Pat. No. 7,675,181, which claims the benefit of Korean Patent Application No. 10-2006-0122589, filed on Dec. 5, 2006 in the Korean Intellectual Property Office, the disclosure of each being incorporated herein in their entirety by reference.

BACKGROUND

1. Technical Field

The present invention relates to a semiconductor package, and more particularly, to a planar multi semiconductor chip package including a memory chip and a processor chip that are connected to each other via through electrodes.

2. Description of the Related Art

A high performance processor such as a CPU or an MPU requires a memory device to/from which a large amount of data can be written/read at high speed, for example, a cache memory device. In a conventional memory device such as a DRAM device, data is read from or written to the DRAM by passing through wires on a system board. In this case, the ratio of the data writing/reading time to the data processing time is increased, thereby decreasing the processing speed of the whole system/processor. In addition, a large system space is required for memory devices and a processor, and thus design rules and the length of wires are increased. The increase in the length of wires causes an increase in input/output power consumption in order to maintain data integrity. In particular, when a CPU is used as a processor, data needs to pass through a controller in order to interface with the memory, and thus the above problems become worse.

One method of solving the above problems is to minimize the length of the wires by stacking a processor chip and a memory chip on the same package substrate.

SUMMARY

The present invention provides a planar multi semiconductor chip package capable of high speed/high performance processing of data, in which a memory chip and a processor chip are connected to each other via through electrodes.

According to an aspect of the present invention, there is provided a planar multi semiconductor chip package. The planar multi semiconductor chip package may comprise: a substrate, a first semiconductor chip, and a second semiconductor chip. The substrate may comprise a plurality of first circuit patterns on a first surface and a plurality of second circuit patterns on a second surface. The first semiconductor chip may comprise a plurality of memory devices arranged on the substrate in an m×n matrix (where m and n are integers equal to or greater than 2), the memory devices including first memory devices and second memory devices, wherein the first memory devices surround at least a portion of the second memory devices. The second semiconductor chip may be stacked on the first semiconductor chip so as to correspond to the second memory devices. A plurality of through electrodes may be arranged on the second memory devices and connect the first and second semiconductor chips to the second circuit pattern of the substrate.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

The present invention will now be described more fully with reference to the accompanying drawings, in which exemplary embodiments of the invention are shown. The invention may, however, be embodied in many different forms, and should not be construed as being limited to the embodiments set forth herein; rather, these embodiments are provided so that this disclosure will be thorough and complete, and will fully convey the concept of the invention to those skilled in the art. In the drawings, the form of elements is exaggerated for clarity. Like reference numerals throughout the specification denote like elements.

Figure 1A:
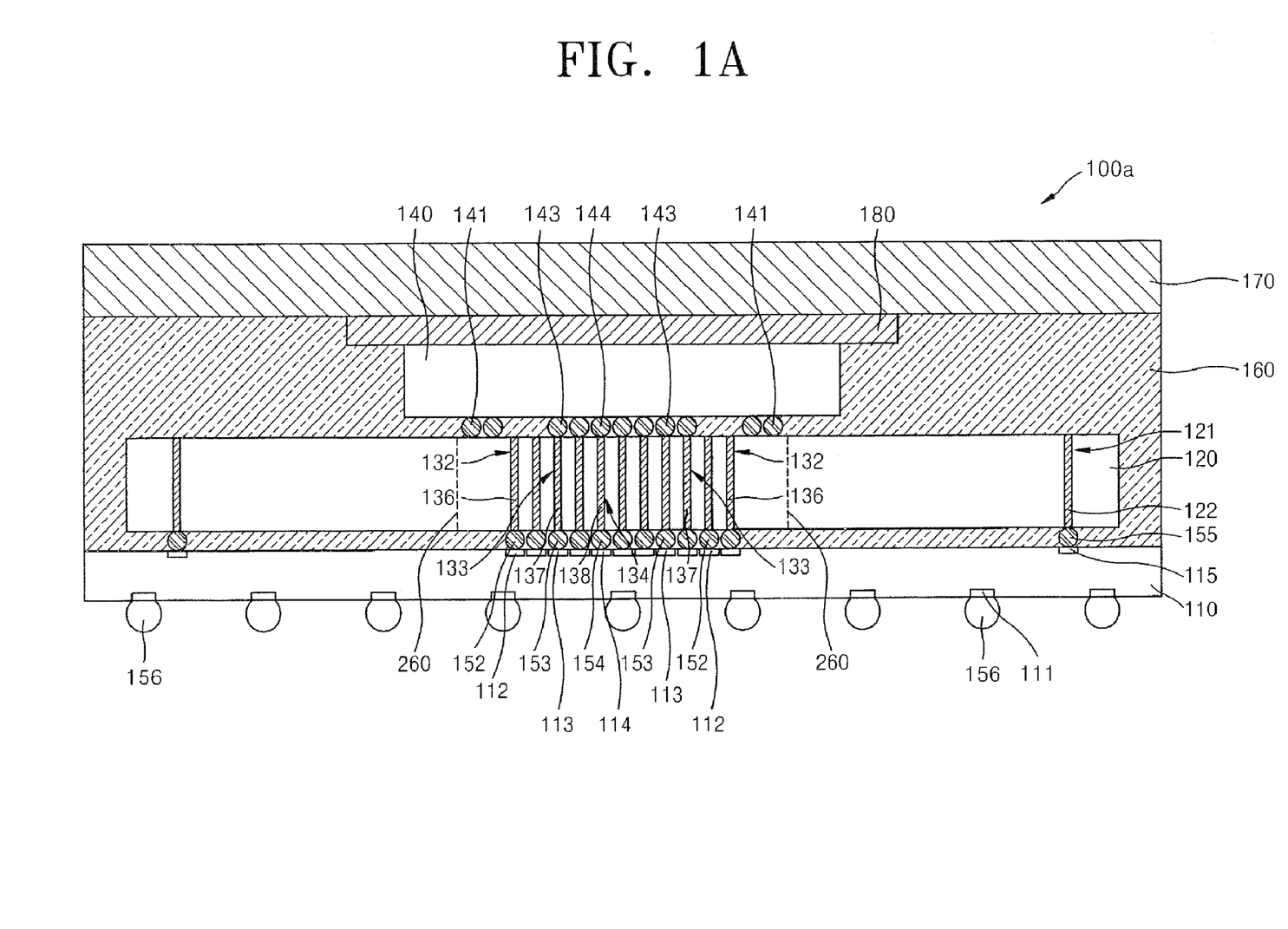
FIGS. 1A and 1B are cross-sectional views of planar multi semiconductor chip packages according to some embodiments of the present invention.
Figure 1B:
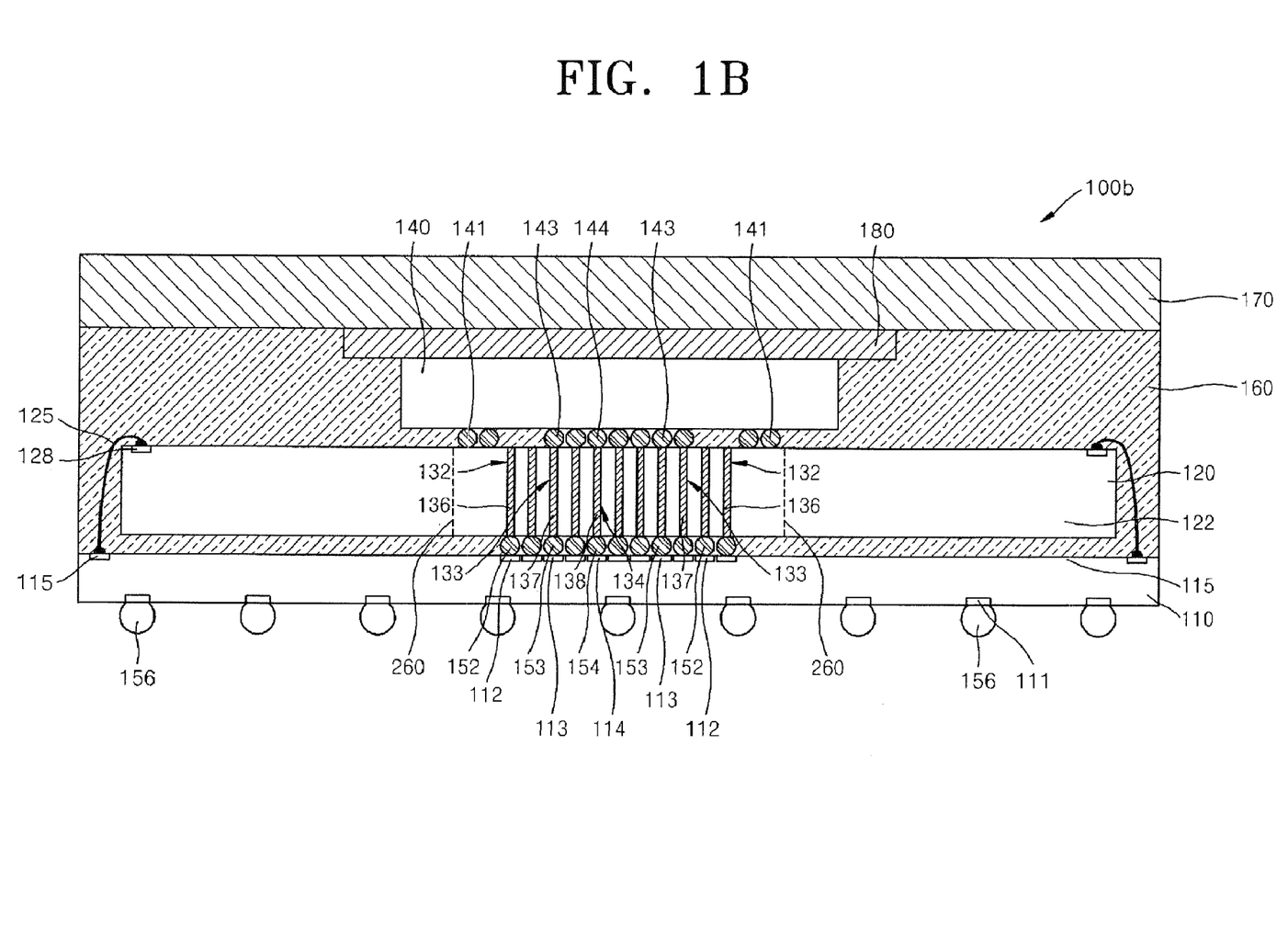
Figure 2:
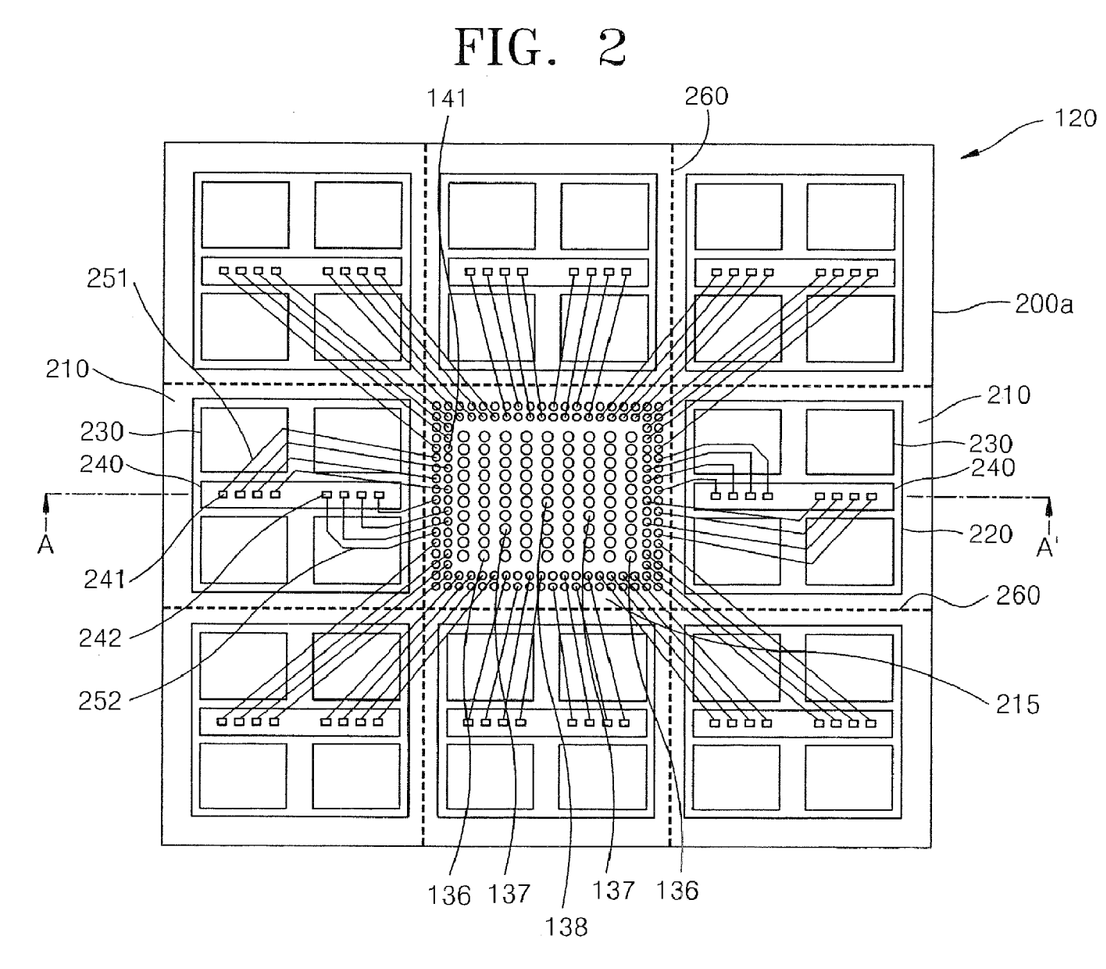
FIG. 2 is a plan view of a first semiconductor chip of the planar multi semiconductor chip package of FIG. 1A.

FIGS. 1A and 1B are cross-sectional views of planar multi semiconductor chip packages 100a and 100b according to some embodiments of the present invention. FIG. 2 is a plan view of a first semiconductor chip of the planar multi semiconductor chip package of FIG. 1A.

Referring to FIGS. 1A and 1B, each of the planar multi semiconductor chip packages 100a and 100b includes a substrate 110, a first semiconductor chip 120, and a second semiconductor chip 140. The substrate 110 may include a print circuit board. A plurality of first circuit patterns 111 are arranged on a first surface of the substrate 110, and a plurality of second circuit patterns 112, 113, 114, and 115 are arranged on a second surface of the substrate 110. The first circuit patterns 111 and the second circuit patterns 112, 113, 114, and 115 can be electrically connected to one another through circuit wiring (not shown) arranged on the substrate 110. External contact terminals 156 are arranged on the first circuit pattern 111, respectively. The external contact terminals 156 may include solder balls.

The first semiconductor chip 120 includes a planar multi semiconductor chip. Referring to FIG. 2, the first semiconductor chip 120 includes a wafer 200a, a plurality of memory devices 220, and a plurality of through electrodes 136, 137, and 138. A plurality of chip regions 210 and 215 partitioned by a scribe line 260 are arranged in an m×n matrix (where m and n are integers equal to or greater than 2) on the wafer 200a. In at least one or more second chip regions 215 of the chip regions 210 and 215, a plurality of second through fourth through holes 132, 133, and 134 are formed, and in the second through fourth through holes 132, 133, and 134, second through fourth through electrodes 136, 137, and 138 are arranged, respectively. Memory devices 220 are arranged in each of the first chip regions 210 of the chip regions 210 and 215. In other words, memory devices 220 are arranged in the first chip regions 210 and second through fourth through electrodes 136, 137, and 138 are arranged in second chip regions 215. The memory devices 220 include a plurality of memory cell arrays 230 and a pad portion 240.

The first chip regions 210 and the second chip regions 215 can be arranged such that the length of redistribution connections between the second through fourth through electrodes 136, 137, and 138 arranged in the second chip region 215 and the memory devices 220 is minimized. The second chip regions 215 may be arranged in the center of the wafer 200a so as to be substantially surrounded by the first chip regions 210. At least a portion of the second chip regions 215 may be arranged so as to be surrounded by the first chip regions 210. For example, when chip regions are formed in a 3×3 matrix, the second through fourth through electrodes 136, 137, and 138 are arranged on one second chip region 215 arranged in the center of the wafer 200a, and eight first chip regions 210 are arranged so as to surround the second chip region 215 and each of the memory devices 220 can be arranged on the first chip regions 210. When chip regions are arranged in a 4×4 matrix, second through fourth through electrodes 136, 137, and 138 are formed in second chip regions 215 arranged in a 2×2 matrix in the center of the wafer 200a, and twelve first chip regions 210 are arranged so as to surround the second chip regions 215 and each of the memory devices 220 can be arranged on the first chip regions 210.

A plurality of memory cells (not shown) are arranged on the memory cell arrays 230, and a plurality of first pads 241 and a plurality of second pads 242 are arranged on the pad portion 240. The first pads 241 are connected to first redistribution lines 251, and the second pads 242 are connected to second redistribution lines 252. The arrangement of the memory cell arrays 230 and the pad portion 240 may be modified in various manners in the memory devices 220. The memory devices 220 may include a DRAM, an SRAM, a flash memory device, an MRAM, a PRAM or other memory devices as is known in the art. The second through fourth electrodes 136, 137, and 138 formed in the first semiconductor chip 120 are arranged in a regular pattern in FIG. 2, but may also be arranged in an irregular pattern to minimize the length of the wiring.

The second semiconductor chip 140 is bonded to the first semiconductor chip 120 in a face-to-face configuration via second and third contact terminals 143 and 144. In other words, an active region surface of the second semiconductor chip 120 may be bonded to an active region surface of the first semiconductor chip 120 via second and third contact terminals 143 and 144. In order to minimize the length of the wiring, the second semiconductor chip 140 is stacked above the first semiconductor chip 120, corresponding to the second through fourth electrodes 136, 137, and 138 formed in the second chip regions 215 of the first semiconductor chip 120. The second semiconductor chip 140 may include a processor such as a CPU, an MPU or a memory controller. The first and second semiconductor chips 120 and 140 are electrically connected to each other via the first contact terminal 141. The second semiconductor chip 140 is electrically connected to each of the second circuit patterns 113 and 114 of the substrate 110 via the third and fourth through electrodes 137 and 138. The first semiconductor chip 120 is electrically connected to the second circuit pattern 112 of the substrate 110 via the second through electrode 136. The second through fourth through electrodes 136, 137, and 138 are connected to the second circuit patterns 112, 113, and 114 of the substrate 110 directly or via fourth through sixth contact terminals 152, 153, and 154. The first through sixth contact terminals 141, 143, 144, and 152 through 154 may include solder balls. The second through fourth through electrodes 136, 137, and 138 may include copper.

The first semiconductor chip 120, the second semiconductor chip 140, and the first through sixth contact terminals 141, 143, 144, and 152 through 154 are coated using a sealing material 160 so as to be protected. The sealing material 160 may include an EMC material as well as an underfill material. The sealing material 160 may be coated such that the top surface of the second semiconductor chip 140 is exposed. A heat sink 170 may be attached above the second semiconductor chip 140 using an adhesive agent 180. The heat sink 170 is for radiating heat from the second semiconductor chip 140, which is a high speed and high power processor chip such as a CPU, and may include a metal frame, a metal thermal interface material or a heat pipe.

Figure 3A:
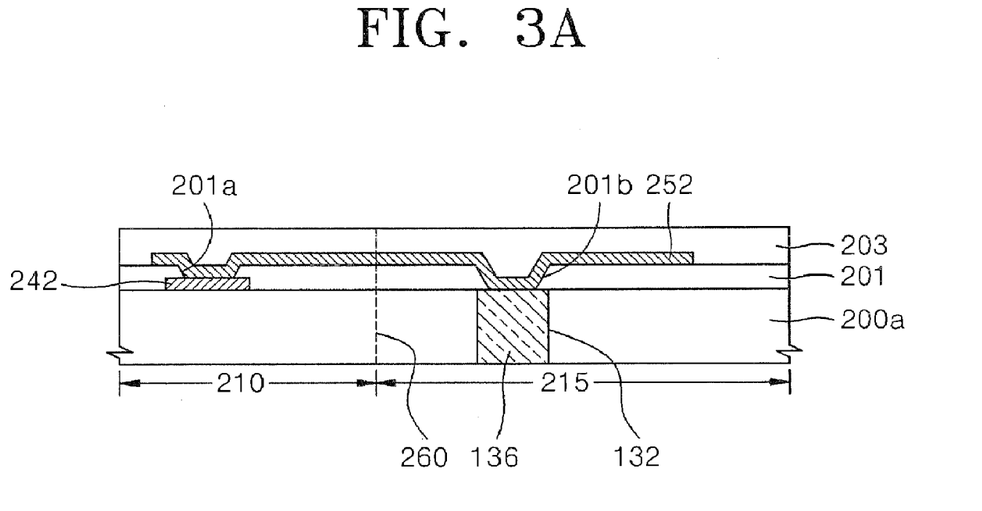
FIG. 3A is a cross-sectional view of the planar multi semiconductor chip package of FIG. 1A, illustrating the connection between the first semiconductor chip and a substrate via a through electrode.

FIGS. 3A through 3D are cross-sectional views of planar multi semiconductor chip packages, illustrating the connection between the first and second semiconductor chips 120 and 140 and the through electrodes 136, 137, and 138. Referring to FIG. 3A, a second through hole 132 is formed on the second chip region 215 of the wafer 200a, and the second through electrode 136 is formed in the second through hole 132. A second pad 242 is formed on the first chip region 210. A first insulating layer 201 including opening portions 201a and 201b exposing portions of the second pad 242 and the second through electrode 136 is formed on the wafer 200a. A second redistribution line 252 is formed on the first insulating layer 201 by a redistribution process, thereby connecting the second pad 242 and the second through electrode 136 electrically via the opening portions 201a and 201b. A second insulating layer 203 is formed on the second redistribution line 252 and the first insulating layer 201. A power voltage, for example, VDD, and a ground voltage, for example, VSS, are provided from outside of the planar multi semiconductor chip package to the second pad 242 of the first semiconductor chip 120 via the substrate 110, the second through electrode 136, and the second redistribution line 252. An insulating layer (not shown) is formed on inner walls of the second through hole 132 to electrically insulate the wafer 200a from the second through electrode 136.

Figure 3B:
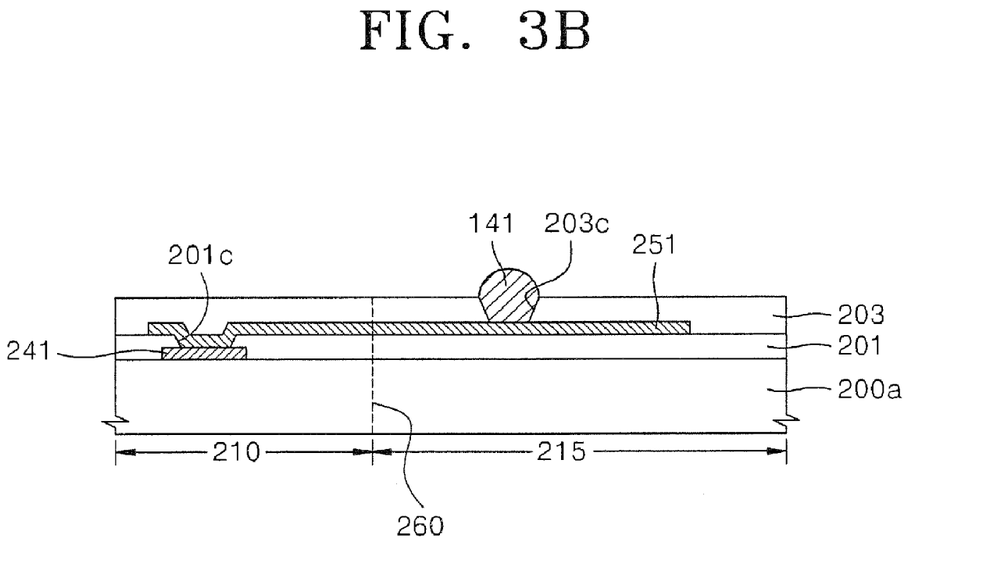
FIG. 3B is a cross-sectional view of the planar multi semiconductor chip package of FIG. 1A, illustrating the connection between the first semiconductor chip and a second semiconductor chip.

Referring to FIG. 3B, a first pad 241 is formed on the first chip region 210 of the wafer 200a. A first insulating layer 201 comprising an opening portion 201c exposing a portion of the first pad 241 is formed on the wafer 200a. A first redistribution line 251 is formed on the first insulating layer 201 by a redistribution process so as to be connected to the first pad 241 via the opening portion 201c. A second insulating layer 203 is formed on the first redistribution line 251 and the first insulating layer 201. The second insulating layer 203 includes an opening portion 203c exposing a portion of the first redistribution line 251. A contact terminal 141 is arranged on the first redistribution line 251 exposed by the opening portion 203c to electrically connect the first pad 241 and the contact terminal 141 via the first redistribution line 251. Accordingly, data can be written to and read from the second semiconductor chip 140 to the first semiconductor chip 120 without passing through the substrate 110.

Though not illustrated in the drawings, a processor voltage signal from the outside, for example, a same power voltage-level VDD and a ground voltage VSS, may be provided to the second semiconductor chip 140 via the substrate 110 and sharing some of the second through electrodes 136 with additional second contact terminals 143 on the second redistribution line 252.

Figure 3C:
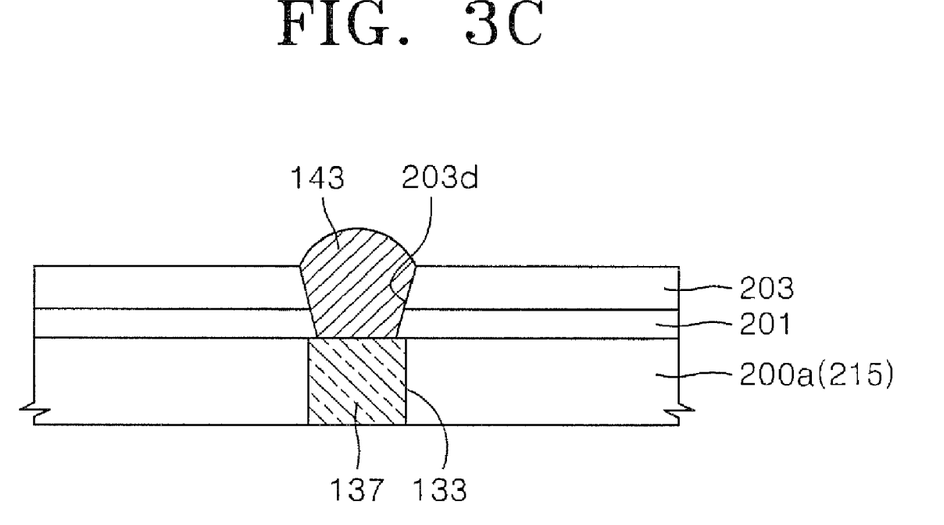
FIGS. 3C and 3D are cross-sectional views of the planar multi semiconductor chip package of FIG. 1A, illustrating the connection between the second semiconductor chip and the substrate via a through electrode.

Referring to FIG. 3C, a third through hole 133 is formed in the second chip region 215 of the wafer 200a and the third through electrode 137 is formed in the third through hole 133. The first and second insulating layers 201 and 203 are formed on the wafer 200a such that a portion of the second through electrode 137 is exposed by an opening portion 203d. A second contact terminal 143 is arranged on the third through electrode 137 exposed by the opening portion 203d. A processor voltage signal from outside of the planar multi semiconductor chip package, for example, a power voltage VDD and/or a ground voltage VSS, is provided to the second semiconductor chip 140 via the substrate 110 and the third through electrode 137. An insulating layer (not shown) is formed on inner walls of the third through hole 133 to electrically insulate the wafer 200a from the third through electrode 137.

Figure 3D:
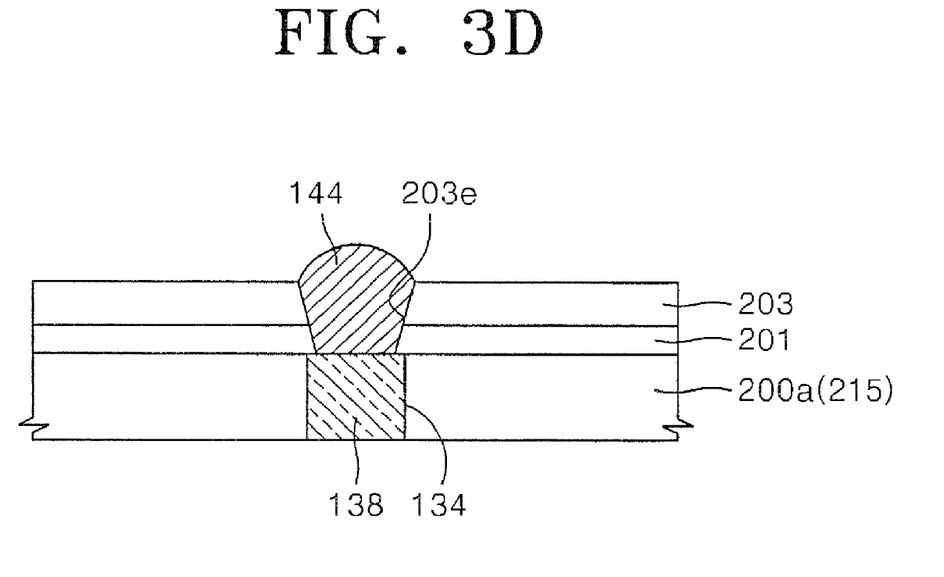

Referring to FIG. 3D, a fourth through hole 134 is formed in the second chip region 215 of the wafer 200a and the fourth through electrode 138 is formed in the fourth through hole 134. The first and second insulating layers 201 and 203 are formed on the wafer 200a such that a portion of the fourth through electrode 138 is exposed by an opening portion 203e. A third contact terminal 144 is arranged on the fourth through electrode 138 exposed by the opening portion 203e. A processor electrical signal, such as a control signal from outside of the planar multi semiconductor chip package, is provided to the second semiconductor chip 140 via the substrate 110 and the fourth through electrode 138. An insulating layer (not shown) is formed on inner walls of the fourth through hole 138 to electrically insulate the wafer 200a from the fourth through electrode 138.

Referring to FIGS. 3C and 3D, though not illustrated, the second and third contact terminals 143 and 144 may be offset from the third and fourth through electrodes 137 and 138, respectively, to match with the pads (not shown) of the second semiconductor chip 140 by using redistribution lines similar to the redistribution lines 215 and 152 in FIGS. 3A and 3B.

Referring again to FIGS. 1A and 2, the first semiconductor chip 120 may further comprise a first through hole 121. The first through hole 121 is formed in a pad portion 240 of the memory devices 220 and is connected to one of the second pads 242. The first through hole 121 may be formed around the memory devices 220, for example, in a scribe region. A first through electrode 122 may be formed in the first through hole 121 and the first through electrode 122 may be electrically connected to the second circuit pattern 115 of the substrate 110 via a seventh contact terminal 155. Alternatively, the first through electrode 122 may be directly connected to the second circuit pattern 115 of the substrate 110. A voltage signal for memory devices, for example, power voltage (VDD) or ground voltage (VSS), may be provided from outside of the planar multi semiconductor chip package to the first semiconductor chip 120 via the first through electrode 122. The seventh contact terminal 155 may include a solder ball. An insulating layer (not shown) is formed on inner walls of the first through hole 121 to electrically insulate the wafer 200a from the first through electrode 122.

Referring to FIG. 1B, the first semiconductor chip 120 may further comprise a chip circuit pattern 128. The chip circuit pattern 128 may be electrically connected to the second circuit pattern 115 of the substrate 110 via a bonding wire 125. A voltage signal for memory devices, for example, power voltage (VDD) or ground voltage (VSS), can be provided from outside of the planar multi semiconductor chip package to the first semiconductor chip 120 via the bonding wire 125.

In one embodiment of FIG. 2, a voltage signal for memory devices can be further provided via the first through electrode 122 or the bonding wire 125 from outside of the planar multi semiconductor chip package, or alternatively via the second through electrode 136 from the outside to the first semiconductor chip 120. Accordingly, since the third through electrode 137, which provides a processor voltage signal to the second semiconductor chip 140 from outside of the planar multi semiconductor chip package, and the first through electrode 122 or the wire 125, which provides a voltage signal for memory devices to the first semiconductor chip 120 from the outside, are arranged separately, a separation effect to minimize power noise can be obtained. Also, the second semiconductor chip 140 is bonded and stacked on the first semiconductor chip 120 via the contact terminals 141, 143, and 144, and thus stress due to the difference of a coefficient of thermal expansion (CTE) can be reduced.

Figure 4A:
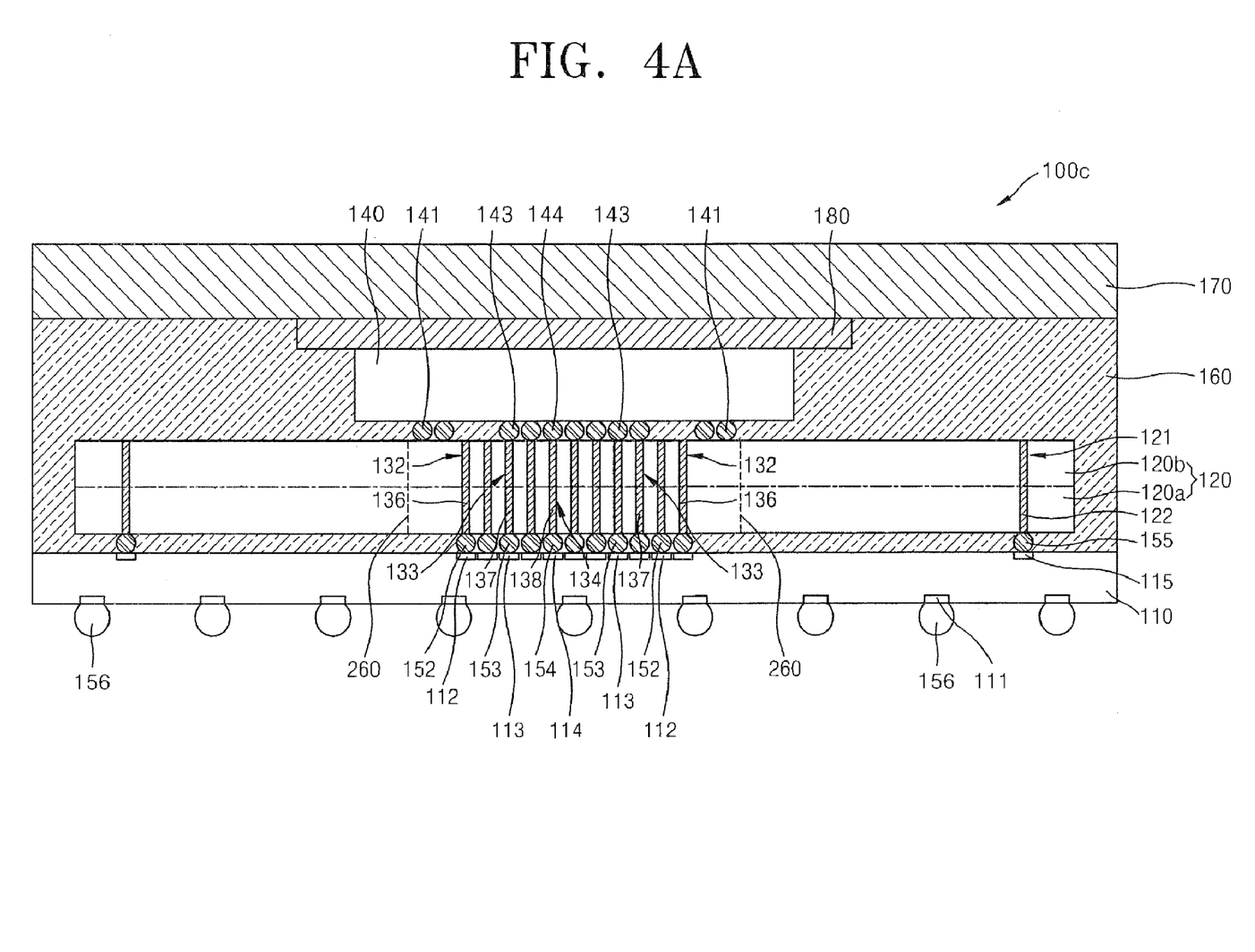
FIGS. 4A and 4B are cross-sectional views of planar multi semiconductor chip packages according to other embodiments of the present invention.
Figure 4B:
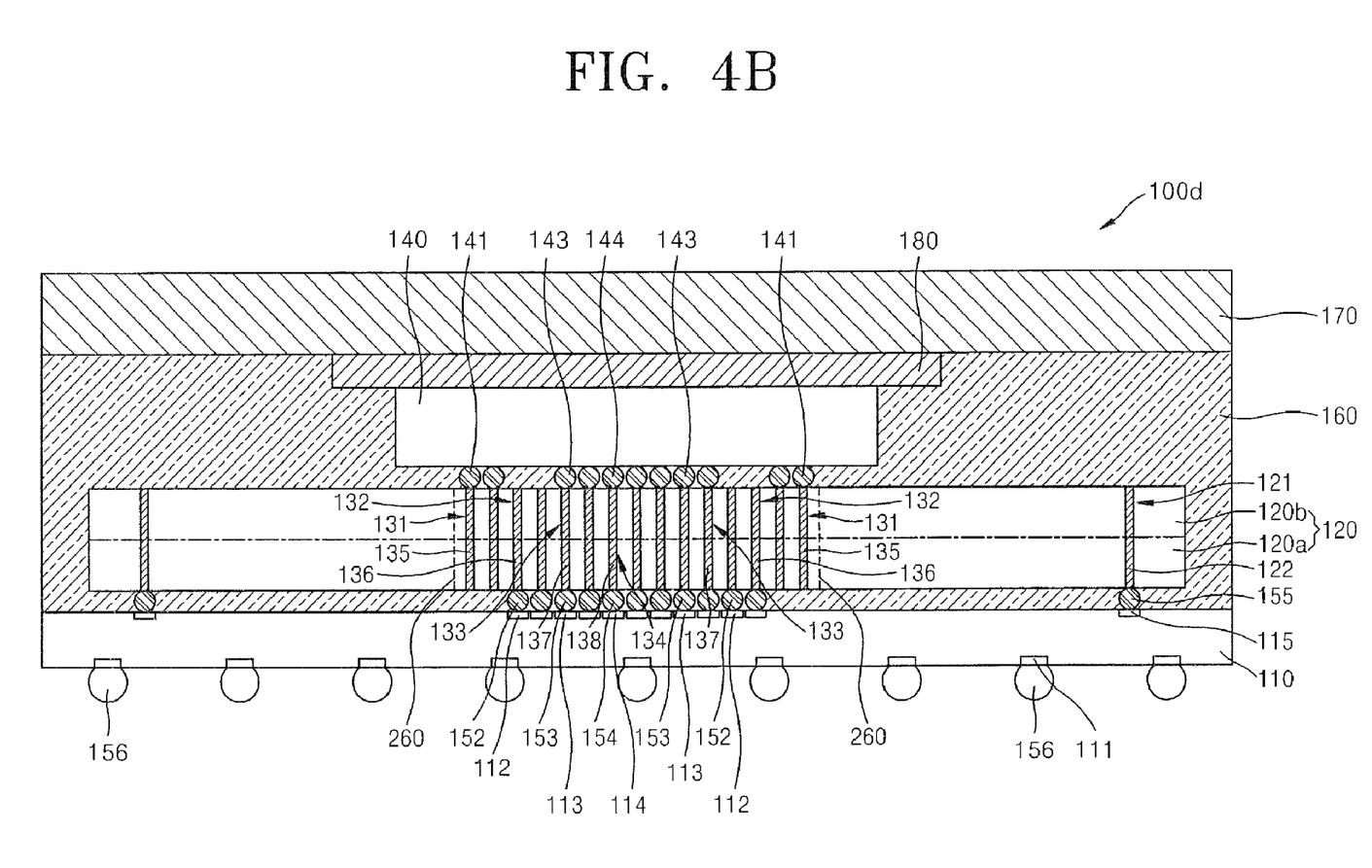

FIGS. 4A and 4B are cross-sectional views of planar multi semiconductor chip packages 100c and 100d in which a memory chip and a processor chip are connected to each other via a through electrode according to other embodiments of the present invention. Referring to FIGS. 4A and 4B, the planar multi semiconductor chip packages 100c and 100d differ from the planar multi semiconductor chip packages 100a and 100b only in that a plurality of semiconductor chips are stacked on the substrate 110 as the first semiconductor chip 120. The first semiconductor chip 120 includes a lower planar multi semiconductor chip 120a and an upper planar multi semiconductor chip 120b. The planar multi semiconductor chip packages 100c and 100d further require through electrodes that electrically connect the lower planar multi semiconductor chip 120a and the second semiconductor chip 140 to enable data writing and reading. In the lower planar multi semiconductor chip 120a, through holes may be further formed in the first chip regions 210 corresponding to the second pads 242 and the first pads 241 on the first memory devices, and through electrodes may be further arranged in the through holes.

Figure 5A:
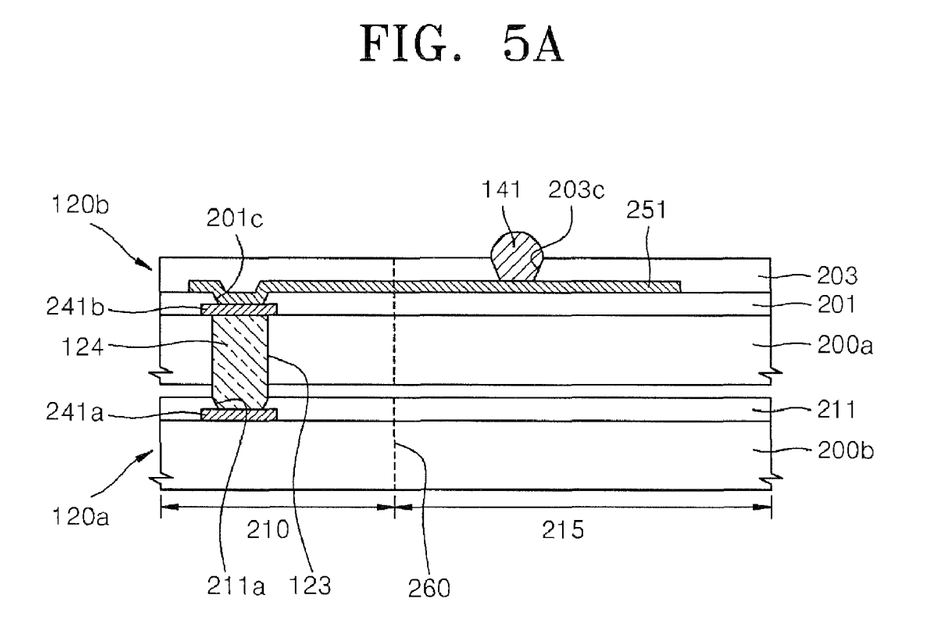
FIG. 5A is a cross-sectional view of the planar multi semiconductor chip package of FIG. 4A, illustrating the connection between a first pad of a lower planar multi semiconductor chip and a second semiconductor chip via a through electrode.

Referring to FIGS. 4A and 5A, in the upper planar multi semiconductor chip 120b, a fifth through hole 123 is formed on the first chip region 210 of the first memory device 220 corresponding to the first pads 241b and a fifth through electrode 124 is formed in the fifth through hole 123. Accordingly, the lower planar multi semiconductor chip 120a and the second semiconductor chip 140 are electrically connected via the fifth through electrode 124 formed in the fifth through hole 123. In other words, data is written to and read from the second semiconductor chip 140 from the first pad 241 of the lower planar multi semiconductor chip 120a via the fifth through electrode 124 of the upper planar multi semiconductor chip 120b and the first pad 241b and the first wiring line 251. In this case, the fifth through electrode 124 connected to the first pad 241a of the lower planar multi semiconductor chip 120a is not connected to the substrate 110. The upper planar multi semiconductor chip 120b and the lower planar multi semiconductor chip 120a are both connected to the second semiconductor chip 140 via the fifth through electrode 124, and thus an additional selection/controlling pin (not shown) may be used to operate the upper planar multi semiconductor chip 120b and the lower planar multi semiconductor chip 120a independently. A fifth through hole 123 may also be formed under the first pad 241a of the lower planar multi semiconductor chip 120a and a fifth through electrode 124 may be formed in the fifth through hole 123.

Figure 5B:
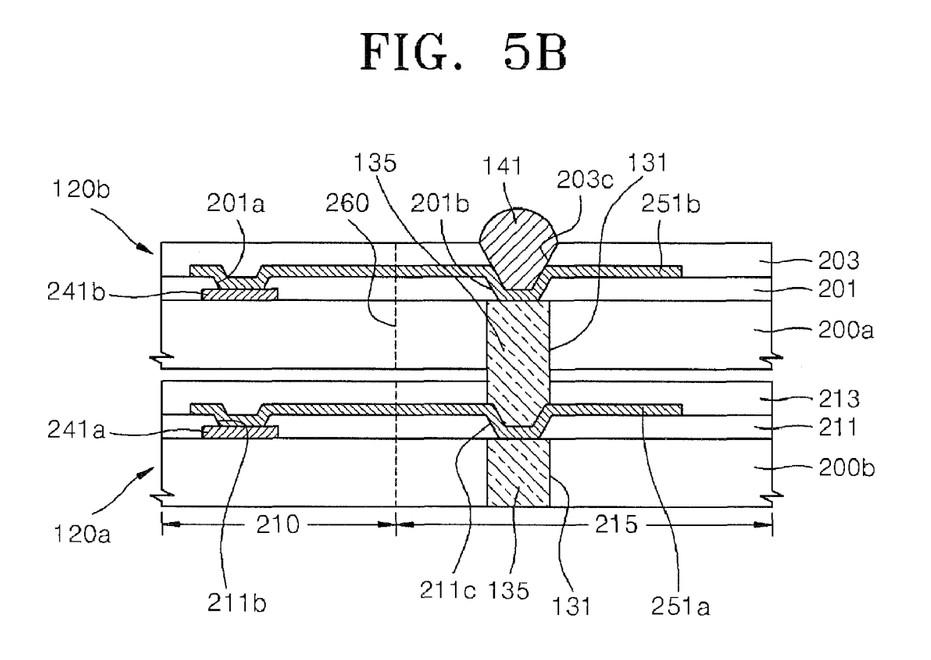
FIG. 5B is a cross-sectional view of the planar multi semiconductor chip package of FIG. 4B, illustrating the connection between a first pad of a lower planar multi semiconductor chip and a second semiconductor chip via a through electrode.

Referring to FIGS. 4B and 5B, a sixth through hole 131 is formed under the first contact terminal 141 in the second chip region 215 of the lower and upper planar multi semiconductor chips 120a and 120b, and a sixth through electrode 135 is formed in the sixth through hole 131. The first pad 241a of the lower planar multi semiconductor chip 120a and the first pad 241b of the upper planar multi semiconductor chip 120b are connected to the sixth through electrode 135 arranged in the sixth through hole 131 via first wiring lines 251a and 251b, respectively, to be electrically connected to the second semiconductor chip 140. Accordingly, data is written and read between the lower and upper multi semiconductor chips 120a and 120b and the second semiconductor chip 140. In this case, the sixth through electrode 135 connected to the first contact terminal 141 may not be connected to the substrate 110, and an additional selection/controlling pin (not shown) may be used to operate the upper planar multi semiconductor chip 120b and the lower planar multi semiconductor chip 120a independently.

Voltage signals can be provided to second pads 242a and 242b of the lower and upper planar multi semiconductor chips 120a and 120b in the same manner described with reference to FIGS. 5A and 5B by using the fifth and sixth through electrodes 124 and 135 formed in the lower planar multi semiconductor chip 120a as well as the upper planar multi semiconductor chip 120b. The lower and upper planar multi semiconductor chips 120a and 120b have the same structure as that of FIGS. 2, and 3A through 3D. The through electrodes 136, 137, and 138 of the lower and upper multi semiconductor chips 120a and 120b contact one another directly or via contact terminals 157 or an anisotropic conductive film (not shown). The through electrodes 122 formed in each of the lower and upper planar multi semiconductor chips 120a and 120b may contact one another directly or via contact terminals and an anisotropic conductive film (not shown). Three or more semiconductor chips may also be stacked in the same manner.

Figure 6A:
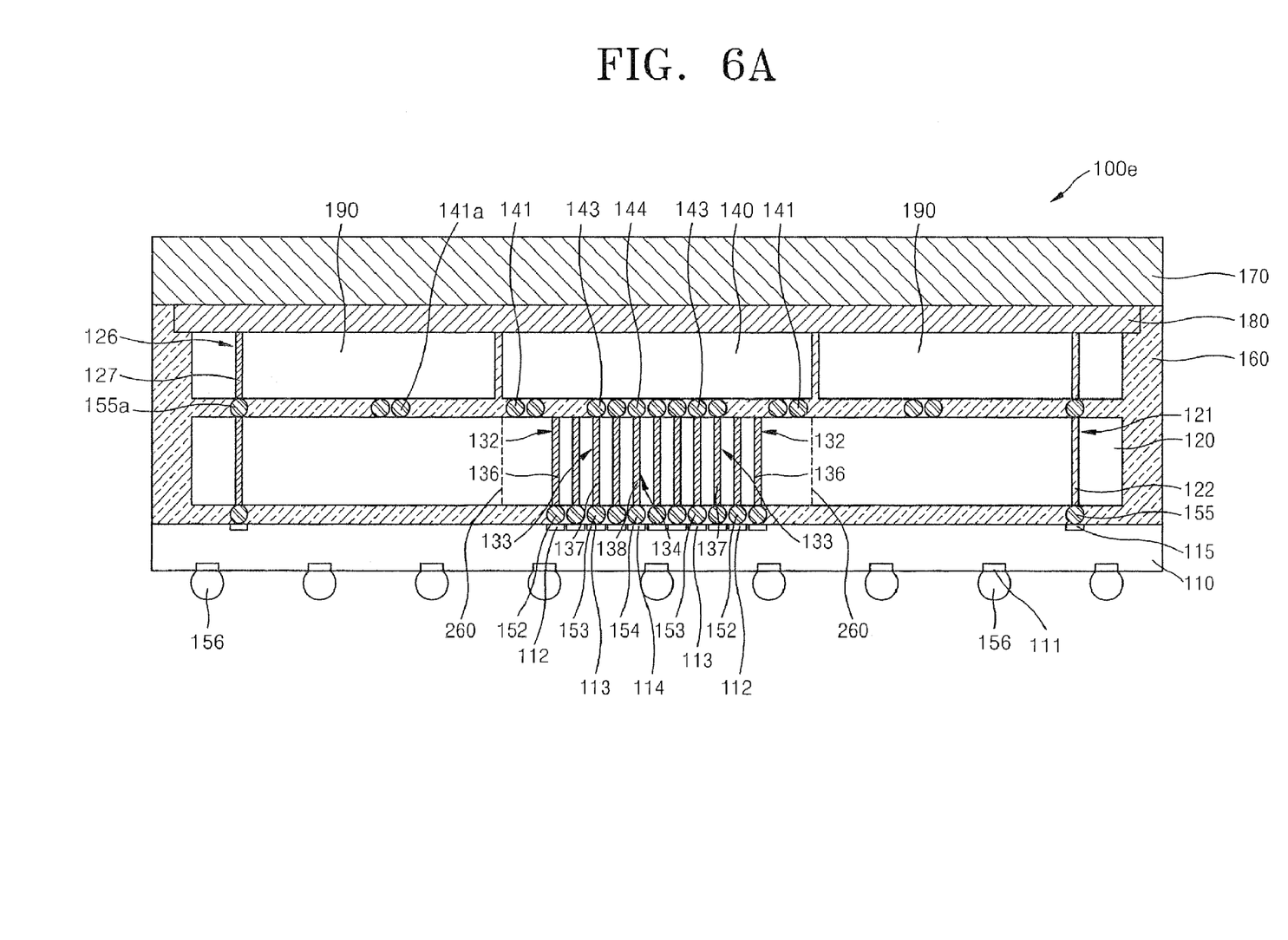
FIGS. 6A and 6B are cross-sectional views of planar multi semiconductor chip packages according to still other embodiments of the present invention.
Figure 6B:
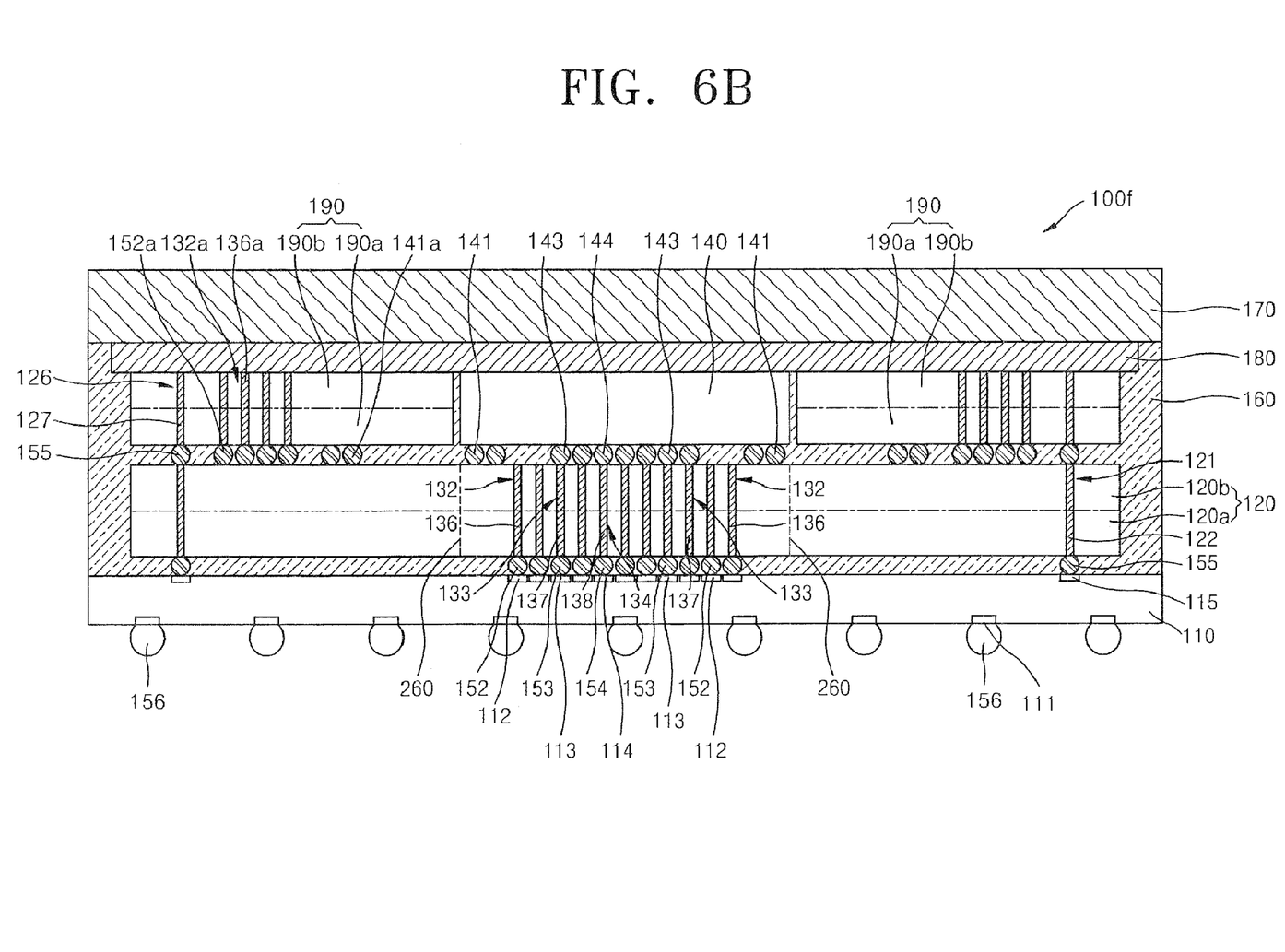

FIGS. 6A and 6B are cross-sectional views of planar multi semiconductor chip packages 100e and 100f in which a memory chip and a processor chip are connected to each other via a through electrode according to still other embodiments of the present invention. Referring to FIGS. 6A and 6B, each of the planar multi semiconductor chip packages 100e and 100f includes a first semiconductor chip 120, a second semiconductor chip 140, and a third semiconductor chip 190. The configuration of the substrate 110 and the first and second semiconductor chips 120 and 140 is the same as that of the planar multi semiconductor chip packages 100a and 100c illustrated in FIGS. 1A and 4A. The third semiconductor chip 190 is arranged corresponding to the first chip region 210 of the first semiconductor chip 120, and the second semiconductor chip 140 is arranged corresponding to the second chip region 215 of the first semiconductor chip 120. The third semiconductor chip 190 is bonded to the first semiconductor chip 120 via contact terminals 155a, 141a, and 152a. The first semiconductor chip 120 includes a plurality of memory devices 220 arranged in the first chip regions 210, and the third semiconductor chip 190 may include at least one memory device arranged corresponding to the memory device 220 of the first semiconductor chip 120.

A first through electrode 127 of the third semiconductor chip 190 arranged in the first through hole 126 may be electrically connected to the first through electrode 122 of the first semiconductor chip 120 via the contact terminal 155a, and the second through electrode 136 of the first semiconductor chip 120 may be connected to the second pad 142 of the third semiconductor chip 190 by a redistribution process as illustrated in FIG. 3A. The third semiconductor chip 190 and the second semiconductor chip 140 may be electrically connected to each other via the contact terminal 141a by a redistribution process as illustrated in FIG. 3B.

As in the first semiconductor chip 120, one or more planar multi semiconductor chips 190a and 190b may also be stacked in the third semiconductor chip 190. The lower planar multi semiconductor chip 190a and the upper planar multi semiconductor chip 190b may electrically contact each other via through electrodes 136a formed in through holes 132a. The through electrodes 136a of the third semiconductor chip 190 may be electrically connected to the through electrodes 136 of the first semiconductor chip 120 via contact terminals 152a by a redistribution process as illustrated in FIG. 3D.

Figure 7:
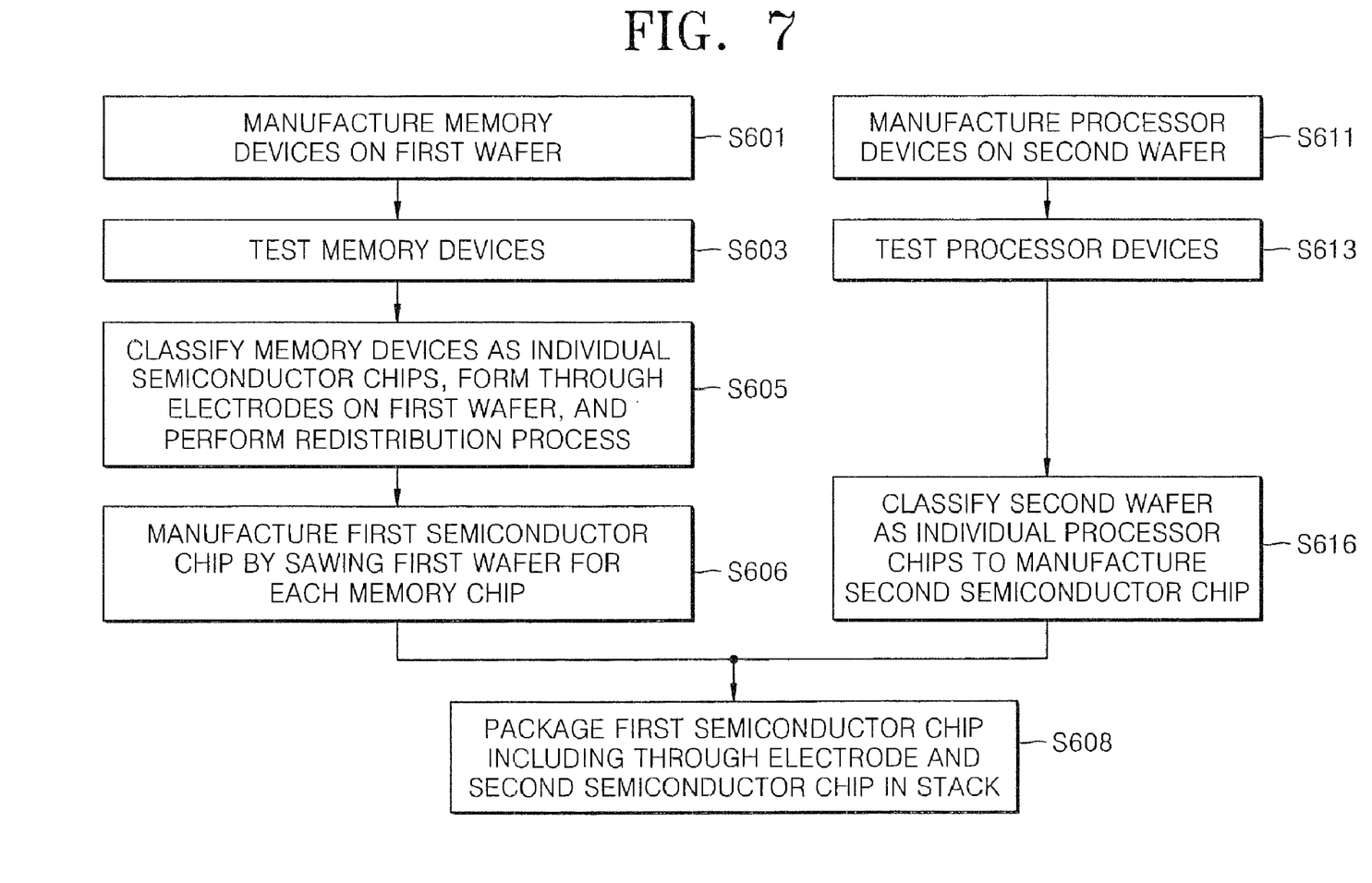
FIG. 7 is a flowchart of a method of manufacturing a planar multi semiconductor chip package according to an embodiment of the present invention.

FIG. 7 is a flowchart of a method of manufacturing the planar multi semiconductor chip packages 100a and 100b according to an embodiment of the present invention. Referring to FIG. 7, in operation S601, a first wafer (200 in FIG. 8) is provided, and memory devices 220 are formed on the first wafer 200 using a semiconductor manufacturing process. In operation S611, a second wafer (not shown) is provided and a processor device is manufactured on the second wafer using a semiconductor manufacturing process. In operation S603, the memory devices 220 are tested to determine potential defects, and in operation S613, processor devices are tested to determine potential defects. The memory devices 220 are classified as individual memory chips in an m×n matrix (where m and n are integers equal to or greater than 2) such that each of the individual memory chips includes at least one memory device 200a including a defect. Through holes 132, 133, and 134 are formed in the second chip region 215 on which the memory devices 220a including defects are arranged using a photographic etching process or laser drilling. Through electrodes 136, 137, and 138 are formed in the through holes 132, 133, and 134 and a redistribution process is performed in operation S605. In operation S606, the first wafer 200 is sawed along a scribe line 260 for each memory chip to manufacture a first semiconductor chip 120.

Figure 8:
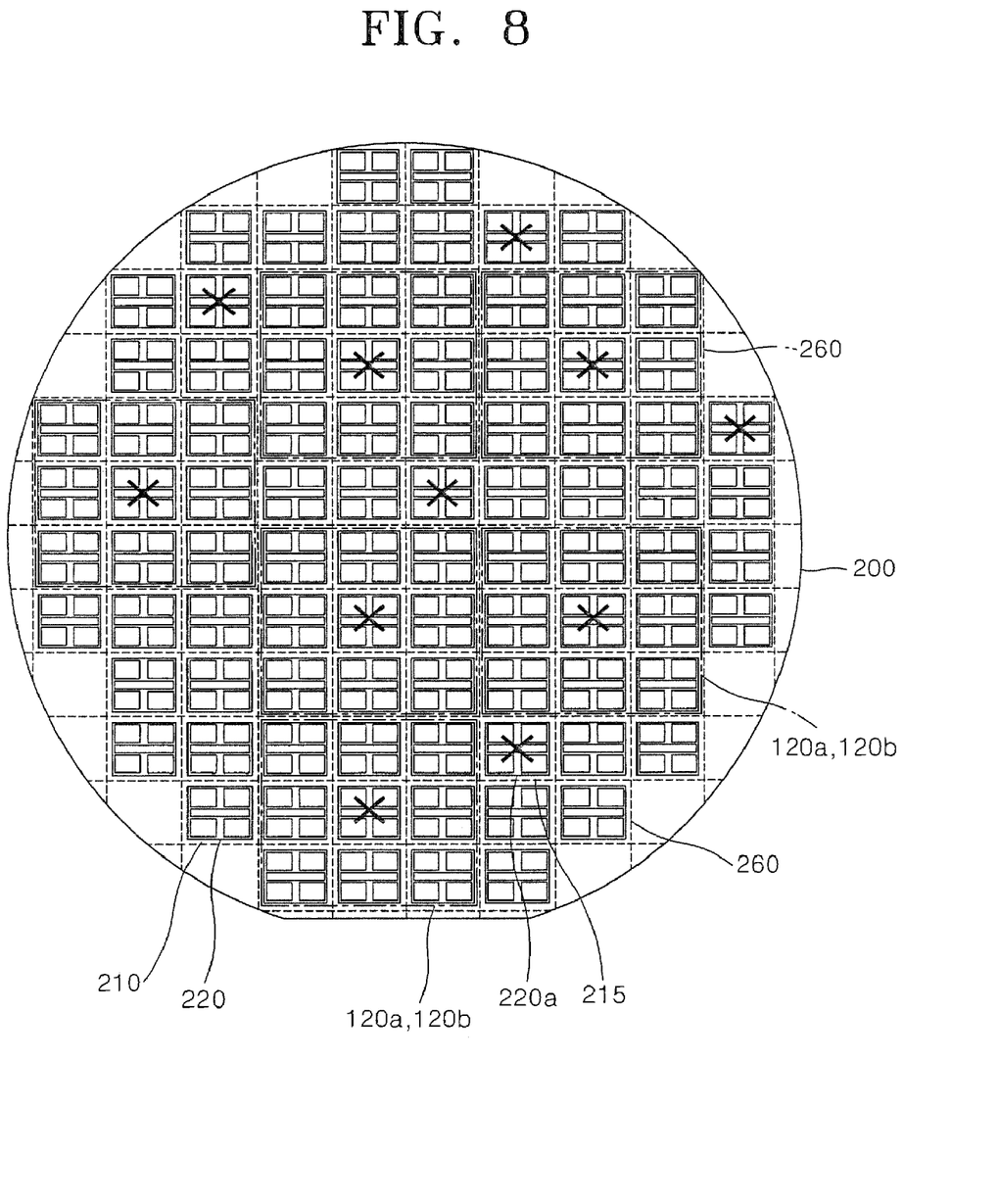
FIG. 8 is a plan view of a semiconductor wafer for explaining a method of sawing the semiconductor wafer during the manufacturing process of the planar multi semiconductor chip package of FIG. 7.

FIG. 8 is a plan view of a semiconductor wafer for explaining a method of sawing the semiconductor wafer during the manufacturing process of the semiconductor package of FIG. 7. Referring to FIG. 8, in operations S605 and S606, the first semiconductor chip 120 is classified into individual memory chips so as to include at least one memory chip including at least one memory device 220a having a defect as determined in operation S603. For example, when the memory chip includes a memory device arranged in a 3×3 matrix, the memory device 220a including a defect may be disposed in the center, and non-defective memory devices 220 may be arranged so as to surround the memory device 220a including the defect. In the case of manufacturing the planar multi semiconductor chip packages 100e and 100f, the memory devices 220 outside of the first semiconductor chip 120 may be used as the third semiconductor chip 190 in operation S605. Also, the wafer 200 may be sawed such that the third semiconductor chip 190 includes at least one memory device 220 according to the size of the first semiconductor chip 120.

Referring back to FIG. 7, the second wafer (not shown) is sawed along the scribe line 260 to separate it into individual processor chips in operation S616. Thus, a second semiconductor chip 140 is manufactured. In operation S608, the first and second semiconductor chips 120 and 140 are mounted on the substrate 110 to manufacture planar multi semiconductor chip packages 100a and 100b. First, the first semiconductor chip 120 is mounted on the substrate 110 such that the through electrodes 136, 137, and 138 of the first semiconductor chip 120 are electrically connected to the second circuit patterns 112, 113, and 114 of the substrate 110, respectively, via the contact terminals 152, 153, and 154. Then, the second semiconductor chip 140 is arranged to correspond to the through electrodes 136, 137, and 138 of the first semiconductor chip 120 such that the second semiconductor chip 140 and the first semiconductor chip 120 are electrically connected to each other via the contact terminals 141, 143, and 144. The first semiconductor chip 120, the second semiconductor chip 140, and the contact terminals 141, 143, 144, and 152 through 154 are coated using a sealing material 160. A heat sink 170 may be attached above the second semiconductor chip 140 using an adhesive agent 180.

According to the present invention, the bandwidth of data transmission can be extended and data can be processed at a high speed by mounting a processor chip and a memory chip for storing data of the processor chip in a semiconductor package and by arranging through electrodes in the memory chip to electrically connect the processor chip and the memory chip. Also, yield of memory devices can be increased by forming through electrodes to correspond to memory cells including defects.

According to an aspect of the present invention, there is provided a planar multi semiconductor chip package. The planar multi semiconductor chip package may comprise: a substrate, a first semiconductor chip, and a second semiconductor chip. The substrate may comprise a plurality of first circuit patterns on a first surface and a plurality of second circuit patterns on a second surface. The first semiconductor chip may comprise a plurality of memory devices arranged on the substrate in an m×n matrix (where m and n are integers equal to or greater than 2), wherein first memory devices of the memory devices surround at least a portion of the second memory devices. The second semiconductor chip may be stacked on the first semiconductor chip and corresponding to the second memory device. A plurality of through electrodes may be arranged on the second memory device and connect the first and second semiconductor chips to the second circuit pattern of the substrate.

At least one of the second memory devices may comprise a memory device including a defect. The first and second semiconductor chips may be bonded face-to-face directly or through contact terminals. The first memory device of the first semiconductor chip may comprise a DRAM, an SRAM, an MRAM, a PRAM, or a flash memory device, and the second semiconductor chip comprises a processor or a memory controller.

The first memory device of the first semiconductor chip may comprise a plurality of first pads and a plurality of second pads, and the through electrodes comprise a plurality of first through third through electrodes. The first pads may be electrically connected to the first through electrodes via first redistribution lines, respectively, and provide voltage signals from the outside to the first semiconductor chip via the substrate, and the second pads may be electrically connected to the second semiconductor chips through second redistribution lines and write and read data from the second semiconductor chips to the first semiconductor chips. The second semiconductor chips may be electrically connected to the substrate via the second through electrodes and voltage signals from the outside are provided to the second semiconductor chips through the substrate, and the second semiconductor chips may be electrically connected to the substrate via the third through electrodes and processor electrical signals from the outside may be provided to the second semiconductor chips via the substrate.

The planar multi semiconductor chip package may further comprise a through electrode for applying voltage signals that is arranged on the first memory device of the first semiconductor chip, wherein the through electrode for applying voltage signals is connected to the second circuit pattern of the substrate directly or through the contact terminal. The first semiconductor chip may further comprise a circuit pattern for applying voltage, and the circuit pattern for applying voltage may be connected to the second circuit pattern through wires.

The first and second semiconductor chips and the substrate may be protected by being coated with a sealing material. A heat sink may be formed above the second semiconductor chip for heat radiation.

In the first semiconductor chip, a plurality of planar multi semiconductor chips may be stacked and the through electrodes may be arranged on the second memory devices of each of the planar multi semiconductor chips, wherein the through electrodes of upper and lower planar multi semiconductor chips may contact each other directly or via contact terminals. The first memory device of each planar multi semiconductor chip of the first semiconductor chip may comprise a plurality of first pads, a plurality of second pads and a plurality of through electrodes for connection arranged under the first pads or the second pads, and the lower planar multi semiconductor chips and the second semiconductor chip are electrically connected via the through electrodes. Also, the first memory device of each planar multi semiconductor chip of the first semiconductor chip may comprise a plurality of first pads and a plurality of second pads, and the second memory device may comprise a plurality of through electrodes for connection connected to the first or second pads, and the lower planar multi semiconductor chips and the second semiconductor chip are electrically connected via the through electrodes.

The planar multi semiconductor chip package may further comprise at least one third semiconductor chip that is arranged to correspond to at least one of the first memory devices of the first semiconductor chip and electrically connected to the substrate and the second semiconductor chip. The third semiconductor chip may comprise a planar multi semiconductor chip that is one of a DRAM, an SRAM, an MRAM, a PRAM and a flash memory device. The third semiconductor chip may be connected to the through electrodes by redistribution lines to directly contact the substrate. The third semiconductor chip may be connected to the second semiconductor chip via the redistribution lines, thereby writing and reading data from the second semiconductor chip to the third semiconductor chip. A plurality of multi planar semiconductor chips may be stacked in the third semiconductor chip with through electrodes, wherein the through electrodes arranged on the third semiconductor chip are connected to the redistribution lines.

According to another aspect of the present invention, there is provided a method of manufacturing a planar multi semiconductor chip package. First, a plurality of memory devices are manufactured on a first wafer, and a testing process is performed to judge whether the memory devices include defects to classify the first wafer into individual memory chips. The memory devices are arranged in an m×n matrix (where m and n are integers equal to or greater than 2) in the memory chip and at least one of second memory devices of the memory chip is surrounded by first memory devices. A plurality of through holes are formed in the second memory device of the memory chip, and a plurality of through electrodes are formed in each of the through holes. Next, a redistribution process is performed. The forming a plurality of through holes and the redistribution process may be performed at the same time. A first semiconductor chip is manufactured by sawing the first wafer for each memory chip. The first semiconductor chip may include a multi semiconductor chip. A plurality of processor devices may be formed on a second wafer, and whether the processor devices include defects is tested. The second wafer is sawed so as to be separated into individual processor chips in order to manufacture a second semiconductor chip. The first semiconductor chip is mounted on the substrate and the second semiconductor chip is bonded to correspond to the second memory device of the first semiconductor chip face to face, wherein the first and second semiconductor chips are electrically connected to each other via the substrate and the through electrodes. The first semiconductor chip, the second semiconductor chip, and the substrate are coated using a sealing material and/or a heat sink.

At least one of the memory devices may include a memory device including a defect. Arranging a third semiconductor chip comprising at least one memory device to correspond to the first memory device may be further included. The third semiconductor chip may be manufactured in the sawing process to include at least one of the memory devices manufactured on the first wafer, and the third semiconductor chip may be arranged on the first semiconductor chip before or after arranging the second semiconductor chip on the first semiconductor chip.

While the present invention has been particularly shown and described with reference to exemplary embodiments thereof, it will be understood by those of ordinary skill in the art that various changes in form and details may be made therein without departing from the spirit and scope of the present invention as defined by the following claims.

I claim:

1. A semiconductor device comprising:
    a first semiconductor chip comprising a plurality of memory devices including a first memory device and a second memory device, the first semiconductor chip comprising a through electrode formed in a memory cell array of the second memory device, and a redistribution line connecting a chip pad of the first memory device to the through electrode; and
    a second semiconductor chip face to face stacked on the first semiconductor chip and corresponding to the first semiconductor chip via the through electrode.

2. The semiconductor device of claim 1, wherein the first semiconductor chip comprises a scribe line between two of the plurality of memory devices.

3. The semiconductor device of claim 2, the redistribution line passes over the scribe line.

4. The semiconductor device of claim 1, wherein the plurality of memory devices comprises a plurality of first memory devices.

5. The semiconductor device of claim 4, wherein the second memory device includes a defect.

6. The semiconductor device of claim 4, wherein each of the first memory devices include a first chip pad connected to a corresponding first through electrode formed in the memory cell array of the second memory device.

7. The semiconductor device of claim 6, wherein a corresponding first redistribution line connects each first chip pad of each of the corresponding first memory devices to the corresponding first through electrode of the second memory device.

8. The semiconductor device of claim 4, further comprising:
    a substrate on which the first semiconductor chip is mounted; and
    a third semiconductor chip that is arranged to correspond to one of the first memory devices of the first semiconductor chip and electrically connected to the substrate and the second semiconductor chip.

9. The semiconductor device of claim 8, further comprising a plurality of third semiconductor chips each arranged to correspond to a corresponding one of the first memory devices and each comprising through electrodes.

10. The semiconductor device of claim 9, wherein each third semiconductor chip is connected to a corresponding through electrode of the second memory device by a corresponding redistribution line.

11. The semiconductor device of claim 1, further comprising a substrate where the first semiconductor chip is stacked thereon.

12. The semiconductor device of claim 11, further comprising:
    a plurality of first pads and a plurality of second pads,
    a plurality of first redistribution lines and a plurality of second redistribution lines, and
    a plurality of first, second, and third through electrodes.

13. The semiconductor device of claim 12, wherein the first pads are electrically connected to the first through electrodes via the first redistribution lines, respectively, and the first pads provide voltage signals originating outside of the semiconductor device to the first memory devices via the substrate.

14. The semiconductor device of claim 13, wherein the second pads are electrically connected to the second semiconductor chip through second redistribution lines thereby providing a connection for write and read data from the second semiconductor chip to the first semiconductor chip.

15. The semiconductor device of claim 14, wherein the second semiconductor chip is electrically connected to the substrate via the second and third through electrodes such that processor electrical signals are provided to the second semiconductor chip through the substrate.

16. The semiconductor device of claim 11, further comprising a heat sink disposed above the second semiconductor chip.

17. The semiconductor device of claim 1, wherein the second memory device includes a plurality of through electrodes regularly distributed across the second memory device.

18. The semiconductor device of claim 1, wherein the second memory device includes a plurality of through electrodes distributed in a matrix pattern in the second memory device.

19. The semiconductor device of claim 1, wherein the second memory device includes a plurality of through electrodes in each of the memory cell array arrays of the second memory device.

20. A semiconductor device comprising:
a plurality of first memory devices, each first memory device including a side surface and a chip pad;
a second memory device including a side surface and a plurality of through electrodes formed in a one or more memory cell arrays of the second memory device; and
a processor chip on the second memory device,
wherein the side surface of each of the first memory devices is directly adjacent a corresponding side surface of the second memory device with a corresponding scribe line formed therebetween.

21. The semiconductor device of claim 20, further comprising:
a plurality of redistribution lines, each redistribution line connecting a chip pad of a corresponding first memory device to a corresponding through electrode of the second memory device,
wherein each redistribution line passes over a corresponding scribe line.

22. The semiconductor device of claim 21, further comprising;
a contact terminal between the processor chip and a first through electrode of the plurality of through electrodes, and
wherein the contact terminal directly contacts with the first through electrode.

23. The semiconductor device of claim 20, wherein the second memory device is defective.

24. The semiconductor device of claim 23, wherein the second memory device includes a manufacturing defect.

25. A semiconductor device comprising:
a substrate comprising a plurality of first circuit patterns on a first surface and a plurality of second circuit patterns on a second surface;
a first semiconductor chip comprising a plurality of memory devices arranged on the substrate in an m×n matrix (where m or n is an integer equal to or greater than 2), the memory devices comprising first memory devices and a second memory device and wherein the first memory devices substantially surround at least a portion of the second memory device;
a second semiconductor chip stacked on the first semiconductor chip and corresponding to the at least a portion of the second memory device;
a plurality of through electrodes arranged on the second memory device and connecting the first and second semiconductor chips to the second circuit pattern of the substrate; and
wherein the plurality of through electrodes are formed in a memory cell array of the second memory device.

26. The semiconductor device of claim 25, wherein the plurality of through electrodes are not arranged on areas between the plurality of memory devices.

* * * * *